(12) United States Patent
Russell et al.

(10) Patent No.: US 7,776,743 B2
(45) Date of Patent: Aug. 17, 2010

(54) METHOD OF FORMING SEMICONDUCTOR DEVICES CONTAINING METAL CAP LAYERS

(75) Inventors: Noel Russell, Waterford, NY (US); Frank M. Cerio, Jr., Albany, NY (US); Gregory Herdt, Selkirk, NY (US)

(73) Assignee: TEL Epion Inc., Billerica, MA (US)

( * ) Notice: Subject to any disclaimer, the term of this patent is extended or adjusted under 35 U.S.C. 154(b) by 25 days.

(21) Appl. No.: 12/182,363

(22) Filed: Jul. 30, 2008

(65) Prior Publication Data

US 2010/0029071 A1 Feb. 4, 2010

(51) Int. Cl.
H01L 21/44 (2006.01)
(52) U.S. Cl. ............... 438/687; 438/686; 257/E21.586
(58) Field of Classification Search .......... 257/E23.011, 257/E23.145, E21.585, E21.586, E21.591, 257/E21.304, 760, 762; 438/471, 473, 510, 438/514, 515, 527, 533, 546, 658, 659, 686, 438/687, 643, 669, 622, 637, 675, 618, 633, 438/778
See application file for complete search history.

(56) References Cited

U.S. PATENT DOCUMENTS

| 4,361,762 A | 11/1982 | Douglas |
| 4,851,895 A | 7/1989 | Green et al. |
| 4,886,971 A | 12/1989 | Matsumura et al. |
| 4,916,311 A | 4/1990 | Fuzishita et al. |
| 4,929,468 A | 5/1990 | Mullendore |
| 4,938,999 A | 7/1990 | Jenkin |
| 5,171,610 A | 12/1992 | Liu |
| 6,287,435 B1 | 9/2001 | Drewery et al. |
| 6,303,809 B1 | 10/2001 | Chi et al. |

(Continued)

FOREIGN PATENT DOCUMENTS

EP 0620291 A1 10/1994

(Continued)

OTHER PUBLICATIONS

Wang et al., Low-temperature Chemical Vapor Deposition and Scaling Limit of Ultrathin Ru Films, Applied Physics Letters, Feb. 23, 2004, pp. 1380-1382, vol. 84, No. 8, American Institute of Physics, Melville, NY.

(Continued)

*Primary Examiner*—Matthew C Landau
*Assistant Examiner*—Jessica Hall
(74) *Attorney, Agent, or Firm*—Wood, Herron & Evans, LLP

(57) ABSTRACT

Embodiments of methods for improving electrical leakage performance and minimizing electromigration in semiconductor devices containing metal cap layers are generally described herein. According to one embodiment, a method of forming a semiconductor device includes planarizing a top surface of a workpiece to form a substantially planar surface with conductive paths and dielectric regions, forming metal cap layers on the conductive paths, and exposing the top surface of the workpiece to a dopant source from a gas cluster ion beam (GCIB) to form doped metal cap layers on the conductive paths and doped dielectric layers on the dielectric regions. According to some embodiments the metal cap layers and the doped metal cap layers contain a noble metal selected from Pt, Au, Ru, Rh, Ir, and Pd.

23 Claims, 5 Drawing Sheets

U.S. PATENT DOCUMENTS

| | | |
|---|---|---|
| 6,319,832 B1 | 11/2001 | Uhlenbrock et al. |
| 6,420,583 B1 | 7/2002 | Lienhard et al. |
| 6,440,495 B1 | 8/2002 | Wade et al. |
| 6,444,263 B1 | 9/2002 | Paranjpe et al. |
| 6,605,735 B2 | 8/2003 | Kawano et al. |
| 6,713,373 B1 | 3/2004 | Omstead |
| 6,989,321 B2 | 1/2006 | Yamasaki et al. |
| 7,107,998 B2 | 9/2006 | Greer et al. |
| 7,211,509 B1 | 5/2007 | Gopinath et al. |
| 2002/0130275 A1 | 9/2002 | Mack et al. |
| 2003/0129306 A1 | 7/2003 | Wade et al. |
| 2004/0084773 A1* | 5/2004 | Johnston et al. ............. 257/751 |
| 2004/0105934 A1 | 6/2004 | Chang et al. |
| 2004/0229452 A1 | 11/2004 | Johnston et al. |
| 2005/0110142 A1 | 5/2005 | Lane et al. |
| 2005/0147762 A1* | 7/2005 | Dubin et al. ................ 427/437 |
| 2005/0186341 A1 | 8/2005 | Hendrix et al. |
| 2006/0105570 A1* | 5/2006 | Hautala et al. .............. 438/687 |

FOREIGN PATENT DOCUMENTS

| | | |
|---|---|---|
| JP | 62296357 A | 12/1987 |
| WO | 0026432 A1 | 5/2000 |
| WO | 2005034223 A1 | 4/2005 |

OTHER PUBLICATIONS

Czekaj, C. et al., Inorganic Chemistry, 1988, 27, pp. 8-10.

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

U.S. Patent and Trademark Office, Non-final Office Action issued for corresponding U.S. Appl. No. 12/369,376 dated May 27, 2010, 41 pp.

* cited by examiner

METHOD OF FORMING SEMICONDUCTOR DEVICES CONTAINING METAL CAP LAYERS

FIELD OF THE INVENTION

The invention relates generally to methods and processing systems for improved dual damascene integration structures for semiconductor integrated circuits.

BACKGROUND OF THE INVENTION

The semiconductor industry has had tremendous success in delivering ever more cost effective chips to market through the use of scaling. However, while scaling works well in device or front-end semiconductor processing, device wiring is not amenable to scaling and results in degraded interconnect resistance and/or capacitance. To alleviate this problem, the industry has been migrating to the use of a lower resistance conductor, such as copper (Cu), and is also introducing lower-k (k=dielectric constant) insulators to reduce capacitance in damascene interconnect structures. Newly developed insulators in the ultra-low-k (ULK) range (k<2.5) are generally characterized by a great deal of porosity (e.g., 30-50%). These materials are extremely fragile and difficult to integrate since they are susceptible to contamination from other sources.

In a dual-damascene (DD) structure, a single metal deposition step is used to simultaneously form Cu metal lines and vias. The Cu metal lines and vias are formed by filling recessed features, such as a trench, a via, or other interconnect structure, in a dielectric film or substrate. After filling, the excess Cu metal that is deposited outside the recessed feature is removed by a chemical-mechanical polishing (CMP) process, thereby forming a planar structure with metal interconnect inlays.

The electrical current density in an integrated circuit's interconnects significantly increases for each successive technology node due to decreasing minimum feature sizes. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials which is directly correlated to adhesion at these interfaces. New materials that provide better adhesion and better EM lifetime have been studied extensively. For example, a cobalt-tungsten-phosphorus (COWP) layer has been selectively deposited on bulk Cu metal using an electroless plating technique. The interface of COWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of COWP.

SUMMARY OF THE INVENTION

The invention relates to a method of forming a semiconductor device having doped metal cap layers on conductive paths and doped dielectric layers on dielectric regions. To that end, the method includes planarizing a top surface of a workpiece to form a substantially planar surface with conductive paths and dielectric regions, forming metal cap layers on the conductive paths, and exposing the top surface of the workpiece to a dopant source from a gas cluster ion beam (GCIB) to form the doped metal cap layers on the conductive paths and the doped dielectric layers on the dielectric regions. In one embodiment, the metal cap layers are selectively formed on the conductive paths relative to the dielectric regions. In another embodiment, additional metal is formed on the dielectric regions. The additional metal may be at least partially removed by the exposure to the GCIB.

BRIEF DESCRIPTION OF THE DRAWINGS

The present invention is illustrated by way of example and not as a limitation in the figures of the accompanying drawings.

DETAILED DESCRIPTION OF SEVERAL EMBODIMENTS OF THE INVENTION

There is a general need for improving the reliability of devices comprising copper and dielectric features, and in particular, conductive paths and dielectric regions between the conductive paths exposed by a planarization process. One way to improve reliability of devices is to getter metal impurities that may be present between conductive paths, resulting in an improved margin for line-to-line breakdown and electrical leakage performance. Metal impurities may be gettered between conductive paths, such as Cu conductive paths, by exposing a surface to a doping source (e.g., a phosphorous (P)-containing source, a boron (B)-containing source, or a nitrogen (N)-containing source) using a gas cluster ion beam (GCIB). Additionally, reliability may be improved by reducing electromigration of the conductive paths by incorporating a dopant into metal cap layers over the conductive paths and into the dielectric regions and optionally also incorporating the dopant into the conductive paths, thereby minimizing a transport of conductive material caused by a momentum transfer between conducting electrons and diffusing metal atoms.

Incorporating a dopant into the metal cap layers over the conductive paths, optionally into the conductive paths, and into the dielectric regions between conductive paths exposed by a planarization process reduces electromigration and provides an improved margin for line-to-line breakdown and electrical leakage performance, resulting in improved output parameters such as device or circuit characteristics. Some embodiments of the invention provide a method for integrating doped metal cap layers into Cu metallization of semiconductor devices to improve electromigration (EM) and stress migration (SM) in the devices. According to some embodiments of the invention, the metal cap layers and the doped metal cap layers contain a noble metal selected from platinum (Pt), gold (Au), ruthenium (Ru), rhodium (Rh), iridium (Ir), and palladium (Pd).

Figure 1:
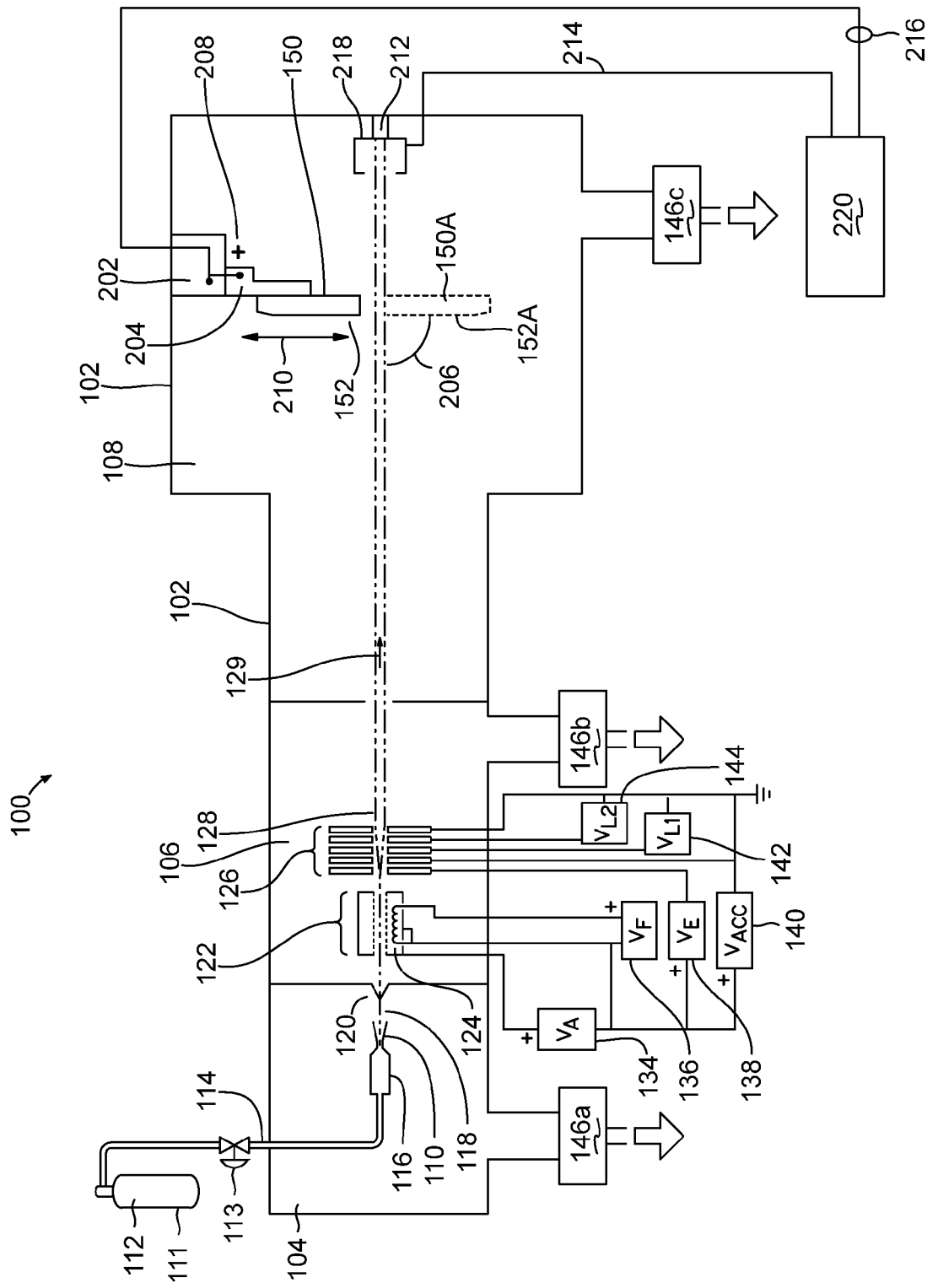
FIG. 1 is a diagrammatic view of a gas cluster ion beam (GCIB) processing apparatus.

With reference to FIG. 1, a GCIB processing apparatus 100 includes a vacuum vessel 102 divided into three communicating chambers, a source chamber 104, an ionization/acceleration chamber 106, and a processing chamber 108. The chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. A condensable source gas 112 may be a gas that condenses at temperatures greater than 30 degrees Kelvin at one atmosphere, whereas a non-condensable source gas may be a gas that condenses at temperatures less than or equal to 30 degrees Kelvin at one atmosphere. Suitable condensable source gases 112 include, but are not necessarily limited to, phosphine ($PH_3$), diborane ($B_2H_6$), nitrogen trifluoride ($NF_3$), ammonia ($NH_3$), argon (Ar), nitrogen ($N_2$), carbon dioxide ($CO_2$), oxygen ($O_2$), and other gases and mixtures thereof. Suitable non-condensable source gases include, but are not necessarily limited to helium (He), neon (Ne), hydrogen ($H_2$), and mixtures thereof.

Cooling, which results from the expansion in the jet, causes a portion of the gas jet 118 to condense into clusters, each comprising from several to several thousand weakly bound atoms or molecules. A gas skimmer aperture 120 partially separates the gas molecules that have not condensed into a cluster from the cluster jet so as to minimize pressure in the downstream regions where such higher pressures would be detrimental (e.g., ionizer 122, high voltage electrodes 126, and processing chamber 108).

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion the clusters to become positively ionized. Some clusters may have more than one electron ejected and may become multiply ionized. A set of suitably biased high voltage electrodes 126 extracts the cluster ions from the ionizer, forming a beam, and then accelerates them to a desired energy (typically with acceleration potentials of from several hundred V to several tens of kV) and focuses them to form a GCIB 128. Filament power supply 136 provides filament voltage $V_F$ to heat the ionizer filament 124. Anode power supply 134 provides anode voltage $V_A$ to accelerate thermoelectrons emitted from filament 124 to cause them to irradiate the cluster-containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150, in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis 129 of the GCIB 128 so that the GCIB 128 has an angle of beam incidence 206 with respect to the workpiece 152 surface. The angle of beam incidence 206 may be any suitable angle, but is typically 90 degrees or near 90 degrees. During Y-scanning, the workpiece 152 and the workpiece holder 150 move from the position shown to the alternate position "A" indicated by the designators 152A and 150A, respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer-based controller, connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2A:
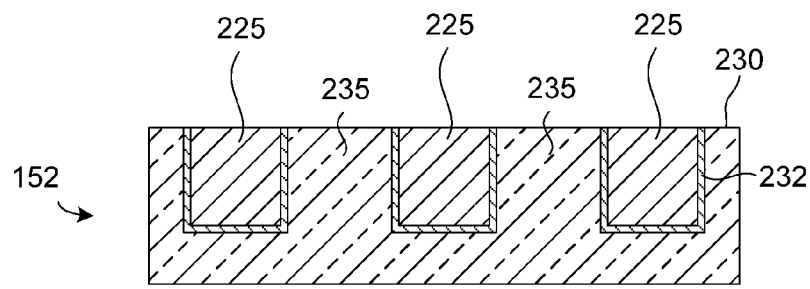
FIG. 2A is a cross-sectional view of a planarized workpiece illustrating conductive paths formed in recessed features.

FIGS. 2A-2D depict, in schematic cross-section, one embodiment of the method of the present invention. With reference to FIG. 2A and in accordance with a representative embodiment, a cross-sectional view of a workpiece 152 with a planarized top surface 230 illustrating conductive paths 225 (e.g., Cu metal conductive paths) formed in recessed features is shown. A planarization process provides the planarized top surface 230 to create a uniform surface while improving the optical resolution of subsequent lithography steps. The planarization process may be terminated by detecting the presence of the top of dielectric regions 235. The conductive paths 225 may be formed from a damascene process or a dual damascene process by etching a plurality of interconnect holes, known as vias, followed by a trench etch into the workpiece 152, a pre-metal dielectric (PMD), or an interlayer dielectric (ILD). The workpiece 152 may comprise silicon (Si), germanium (Ge), or a Group III-V semiconductor such as gallium arsenide (GaAs) or indium antimonide (InSb). A top layer of the workpiece 152 may be formed from an epitaxial layer, a monocrystalline substrate or from a silicon-on-insulator (SOI) layer.

The series of interconnect holes and trenches formed through one or more etching processes may be referred to as recessed features. The recessed features are filled with a metal such as Cu using an electroplating or a physical vapor deposition process (PVD), which is subsequently planarized using a process such as chemical mechanical polishing (CMP), electropolishing, or ion milling to expose dielectric regions 235 and the conductive paths 225 of the workpiece 152.

The conductive paths 225 may be lined with a barrier material 232 to limit the amount of material transfer between the conductive paths 225 and the dielectric regions 235. The barrier material 232 may be formed of one or more layers of tantalum, tantalum nitride, titanium, titanium nitride, tungsten, and/or tungsten nitride. The barrier material may be formed using layering techniques including physical vapor deposition (PVD), atomic layer deposition (ALD), chemical vapor deposition (CVD), plasma enhanced chemical vapor deposition (PECVD), thermal deposition, and evaporation.

Figure 2B:
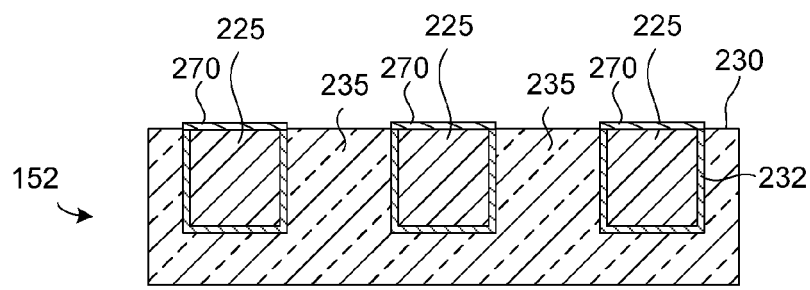
FIG. 2B is an illustration of the workpiece in FIG. 2A after selectively forming metal cap layers on a planar surface of the conductive paths of the workpiece.

FIG. 2B is an illustration of the workpiece in FIG. 2A after selectively forming metal cap layers 270 on a planar surface of the conductive paths 225 of the workpiece 152. According to some embodiments of the invention, the metal cap layers 270 contain a noble metal selected from Pt, Au, Ru, Rh, Ir, and Pd. In one example, an average thickness of the metal cap layers 270 can be between 2 angstrom (angstrom=$10^{-10}$ m) and 100 angstrom, for example about 2, 5, 10, 15, 20, 30, 40, 50, 60, 70, 80, 90, or 100 angstrom. However, embodiments of the invention are not limited to those metal thicknesses and thicker metal cap layers 270 may be formed and utilized.

The metal cap layers 270 are selectively formed on the conductive paths relative to the dielectric regions 235. The metal cap layers 270 may be formed using layering techniques including PVD, ALD, CVD, PECVD, thermal deposition, and evaporation. According to one embodiment, ruthenium (Ru) metal cap layers 270 may be selectively deposited on the conductive paths 225 relative to the dielectric regions 235 by a CVD process. Examples of selective Ru metal deposition processes are described in U.S. patent application Ser. Nos. 11/853,393 and 12/018,074. The entire contents of these applications are incorporated herein by reference.

According to another embodiment, metal may be deposited on the conductive paths 225 and also on the dielectric regions 235 due to loss of selectivity during the metal deposition. Subsequently, metal deposited on the dielectric regions 235 and a portion of the metal deposited on the conductive paths 225 may be removed in a metal removal process to form the metal cap layers 270. Examples of Ru metal deposition followed by a Ru metal removal process are described in U.S. patent application Ser. No. 12/173,814, filed on Jul. 15, 2008. The entire content of this application is incorporated herein by reference.

Figure 2C:
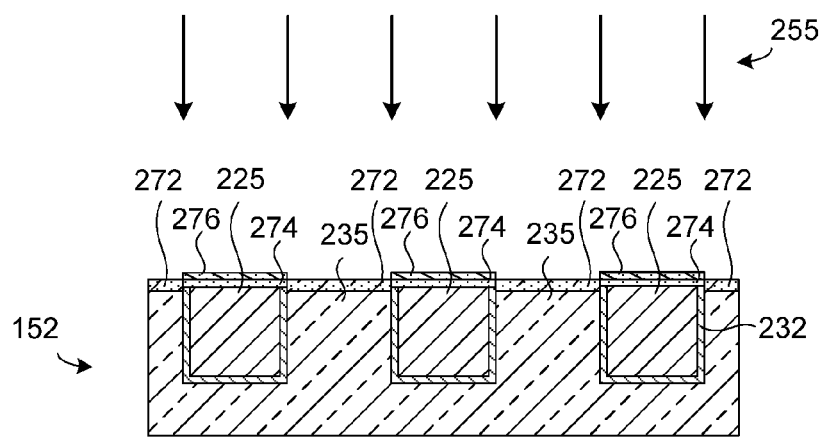
FIG. 2C is an illustration of the workpiece in FIG. 2B after treating the workpiece with a gas cluster ion beam (GCIB) to form doped layers.

FIG. 2C is an illustration of the workpiece 152 in FIG. 2B after treating the workpiece 152 with a dopant source 255 from a GCIB to form doped dielectric layers 272, doped metal cap layers 276, and doped conductive paths 274. According to some embodiments of the invention, the doped metal cap layers 276 contain a noble metal selected from Pt, Au, Ru, Rh, Ir, and Pd. The depth of the dopant incorporation into the workpiece 152 may be controlled by the energy of the dopant atoms and/or dopant molecules in the dopant source 255. In one embodiment, a dopant is incorporated to a depth between 50 and 500 angstrom, or between 100 and 200 angstrom. Although FIG. 2C depicts dopant incorporation into the conductive paths 225 to form the doped conductive paths 274, in other embodiments of the invention, the energy of the dopant atoms and/or dopant molecules along with the thickness of the metal cap layers 270 may be selected to substantially limit the dopant incorporation to the metal cap layers 270 and the dielectric regions 235 and not the conductive paths 225.

The dopant source 255 may be a stream of ionized gas clusters comprising hundreds or thousands of dopant atoms and/or dopant-containing molecules. Examples of dopants include phosphorus (P), boron (B), and nitrogen (N). Examples of dopant-containing molecules include $PH_3$, $BH_3$, $B_2H_6$, $BF_3$, $NF_3$, and $NH_3$. The dopant atoms and/or dopant molecules may be infused into the dielectric regions 235, the metal cap layers 270, and optionally the conductive paths 225 as described above. In one example, the dopant source 255 may be delivered by a GCIB to a dose from about $5\times10^{12}$ atoms/cm$^2$ to about $1\times10^{14}$ atoms/cm$^2$. The doped dielectric layer 272, the doped metal cap layers 276, and optionally the doped conductive paths 274, may contain between 0.1 and 10 atomic % of the dopant.

In one example, a phosphorus source 255 may comprise a single species, such as $PH_3$, or it may comprise a plurality of species including $PH_3$ and a non-condensable source gas, such as He, Ne, and/or $H_2$. In another example, a boron source 255 may comprise a single species, such as $B_2H_6$, or it may comprise a plurality of species including $B_2H_6$ and a non-condensable source gas, such as He, Ne, and/or $H_2$. In yet another example, a nitrogen source 255 may comprise a single species, such as $NF_3$, or it may comprise a plurality of species including $NF_3$ and a non-condensable source gas, such as He, Ne, and/or $H_2$.

GCIB processing has been shown to amorphize crystalline materials to a depth determined by the energy of the dopant atoms and/or dopant molecules. The doped metal cap layers 276 may thus be at least partially amorphized by the dopant source 255 during the GCIB processing. Furthermore, in one example, phosphor doping of metal layers (e.g., Ru metal layers) has been shown to amorphize the metal layers and further inhibit metal grain growth during heat treatments following or during the GCIB processing. This effect can thus aid in inhibiting recrystallization of the doped metal cap layers 276 and provide improved Cu barrier properties relative to undoped polycrystalline metal layers and other metal layers.

Following the dopant incorporation, the workpiece 152 may be annealed using methods known to one skilled in the art to reduce any damage created by the dopant incorporation.

Figure 2D:
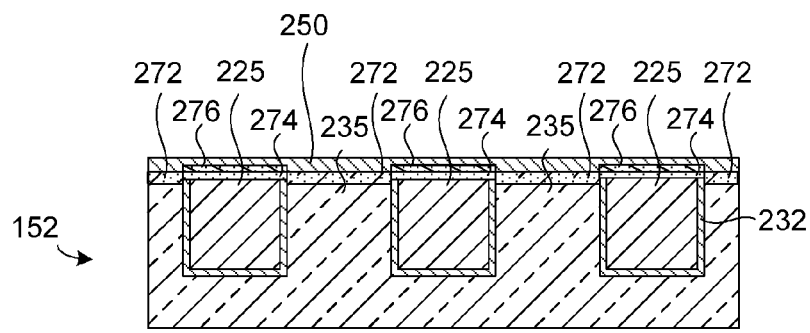
FIG. 2D is an illustration of the workpiece in FIG. 2C after depositing a barrier layer over the workpiece.

FIG. 2D is an illustration of the workpiece 152 in FIG. 2C after forming a barrier layer 250 over the doped metal cap layers 276 and the doped dielectric layer 272. Although not shown in FIG. 2D, the barrier layer 250 may getter any metal impurities between the conductive paths 225. The barrier layer 250 is deposited as a conformal layer using methods known to persons having ordinary skill in the art, such as CVD, PECVD, HDPCVD, MOCVD, ALD, PVD, or GCIB. The barrier layer 250 may comprise dielectric material such as silicon nitride or one or more barrier layer materials such as silicon carbide, nitrogen doped silicon carbide, oxygen doped silicon carbide, boron carbon nitride, and boron nitride.

Figure 3A:
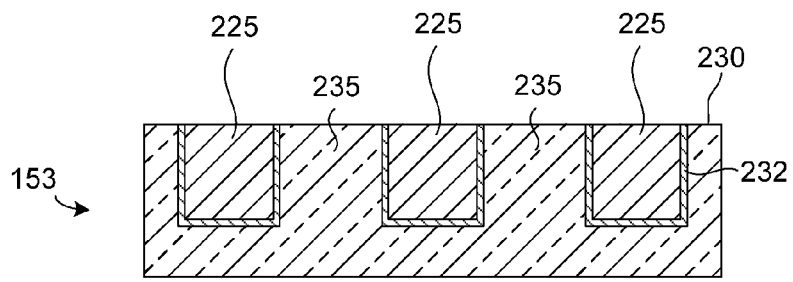
FIG. 3A is a cross-sectional view of a planarized workpiece illustrating conductive paths formed in recessed features.

FIGS. 3A-3D depict, in schematic cross-section, another embodiment of the method of the present invention. FIG. 3A is a cross-sectional view of a workpiece 153 identical to workpiece 152 in FIG. 2A, and containing a planarized top surface 230 illustrating conductive paths 225 formed in the recessed features of dielectric regions 235.

Figure 3B:
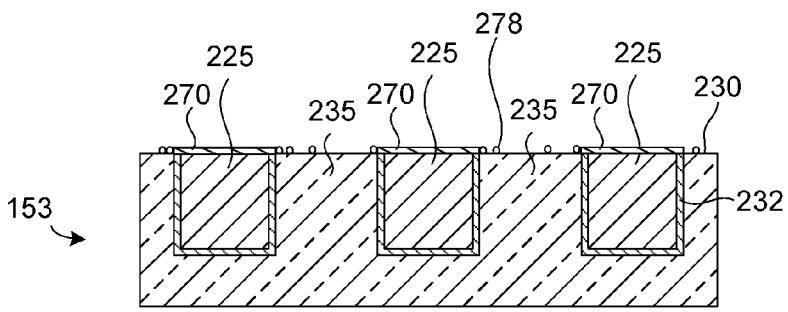
FIG. 3B is an illustration of the workpiece in FIG. 3A after forming metal cap layers on a planar surface of the conductive paths of the workpiece and forming metal on dielectric regions.

FIG. 3B is an illustration of the workpiece in FIG. 3A after forming metal cap layers 270 on a planar surface of the conductive paths of the workpiece 153 and metal 278 on dielectric regions 235. The workpiece 153 depicted in FIG. 3B is similar to the workpiece 152 depicted in FIG. 2B but also contains metal 278 on the dielectric regions 235 as a result of loss of selectivity during metal deposition onto the workpiece 153 depicted in FIG. 3A. According to some embodiments of the invention, the metal cap layers 270 and the metal 278 contain a noble metal selected from Pt, Au, Ru, Rh, Ir, and Pd.

Figure 3C:
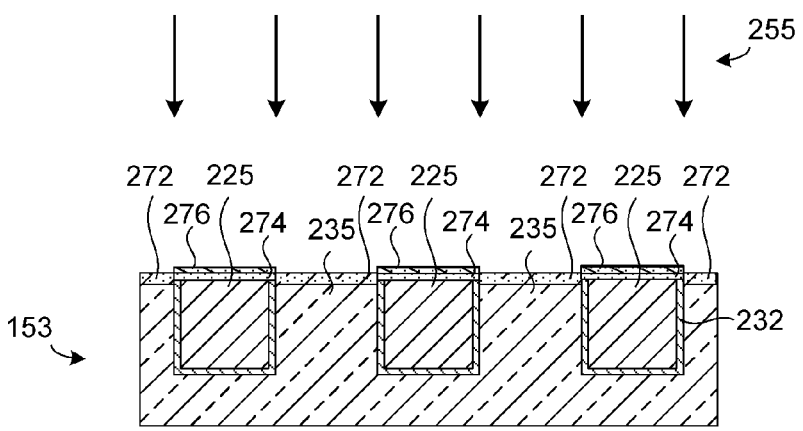
FIG. 3C is an illustration of the workpiece in FIG. 3B after treating the workpiece with a gas cluster ion beam (GCIB) to form doped layers.

FIG. 3C is an illustration of the workpiece 153 in FIG. 3B after treating the workpiece 153 with dopant source 255 during GCIB processing to form doped dielectric layers 272, doped metal cap layers 276, and doped conductive paths 274. According to some embodiments of the invention, the doped metal cap layers 276 contain a noble metal selected from Pt, Au, Ru, Rh, Ir, and Pd.

According to embodiments of the invention, the metal 278 and other metal impurities between the conductive paths 225 may be partially removed from the dielectric regions 235 or completely removed from the dielectric regions 235 as depicted in FIG. 3C by the treating with the dopant source 255. Furthermore, although not shown in FIG. 3C, any metal 278 remaining on the dielectric regions 235 after the treating may be gettered by the dopants. According to one embodiment, the treating may include simultaneous or sequential GCIB exposures of different dopant sources. In one example, the treating can include a first GCIB exposure containing $NF_3$, and a second GCIB exposure containing dopant-containing molecules selected from $PH_3$, $BH_3$, $B_2H_6$, $BF_3$, and $NH_3$, for example. GCIB exposures containing $NF_3$ have been shown to effectively remove noble metals such as Ru from surfaces. The depth of the dopant incorporation into the workpiece 153 may be controlled by the energy of the dopant atoms and/or dopant molecules in the dopant source 255. In one embodiment, a dopant is incorporated to a depth between 50 and 500 angstrom, or between 100 and 200 angstrom. Although FIG. 3C depicts dopant incorporation into the conductive paths 225 to form the doped conductive paths 274, in other embodiments, the energy of the dopant atoms and/or dopant molecules along with the thickness of the metal cap layers 270 may be selected to substantially limit the dopant incorporation to the metal cap layers 270 and the dielectric regions 235 and not the conductive paths 225.

Following the dopant incorporation, the workpiece 153 may be annealed using methods known to one skilled in the art to reduce any damage created by the dopant incorporation.

Figure 3D:
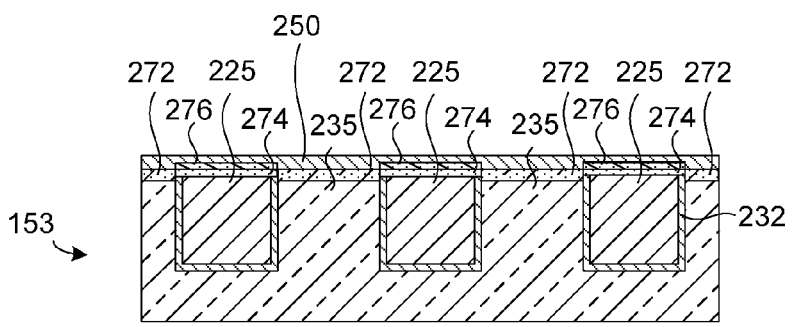
FIG. 3D is an illustration of the workpiece in FIG. 3C after depositing a barrier layer over the workpiece.
Figure 4:
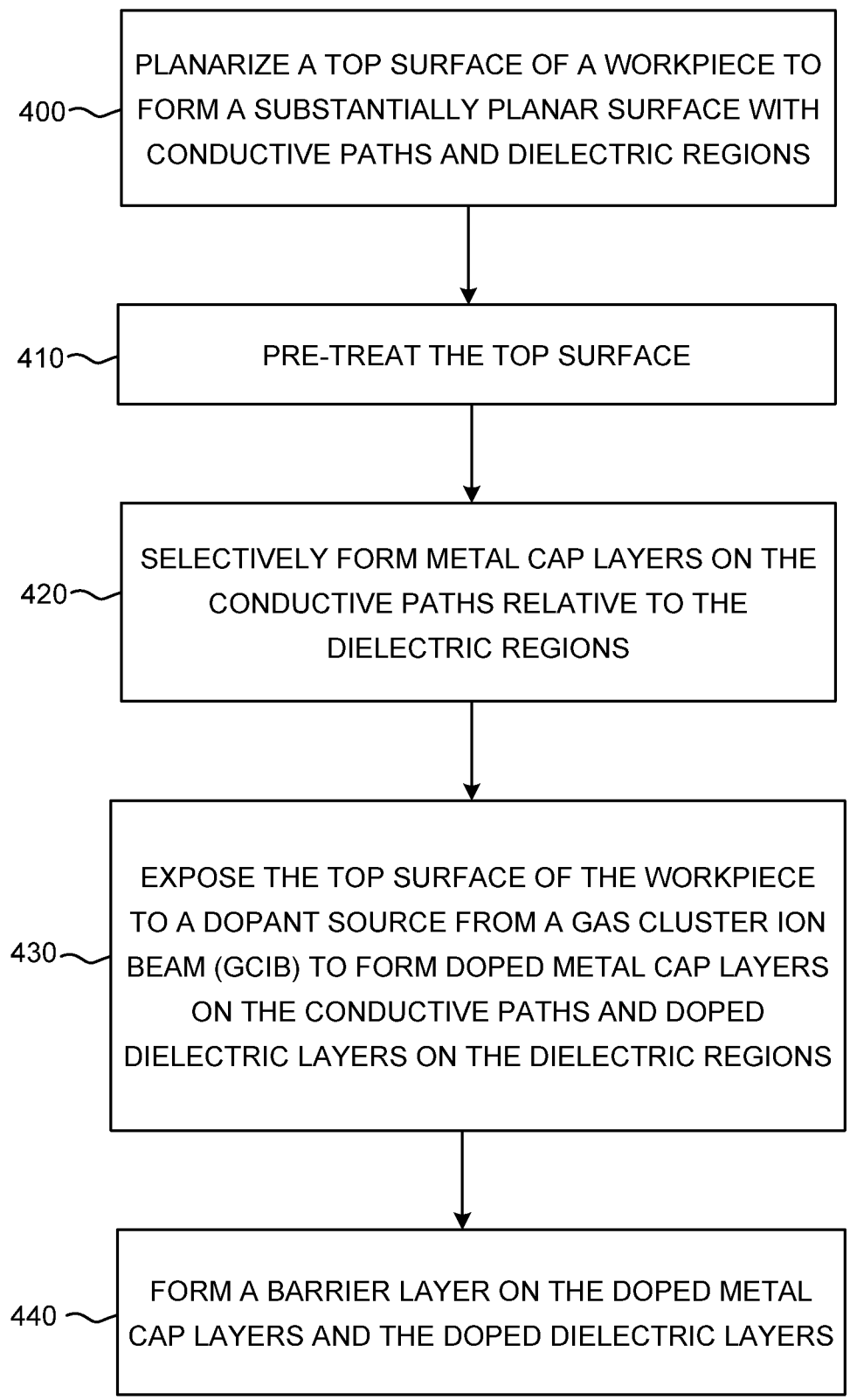
FIG. 4 is a flowchart showing one embodiment of a method of modifying a substantially planar surface of a workpiece with a GCIB.
Figure 5:
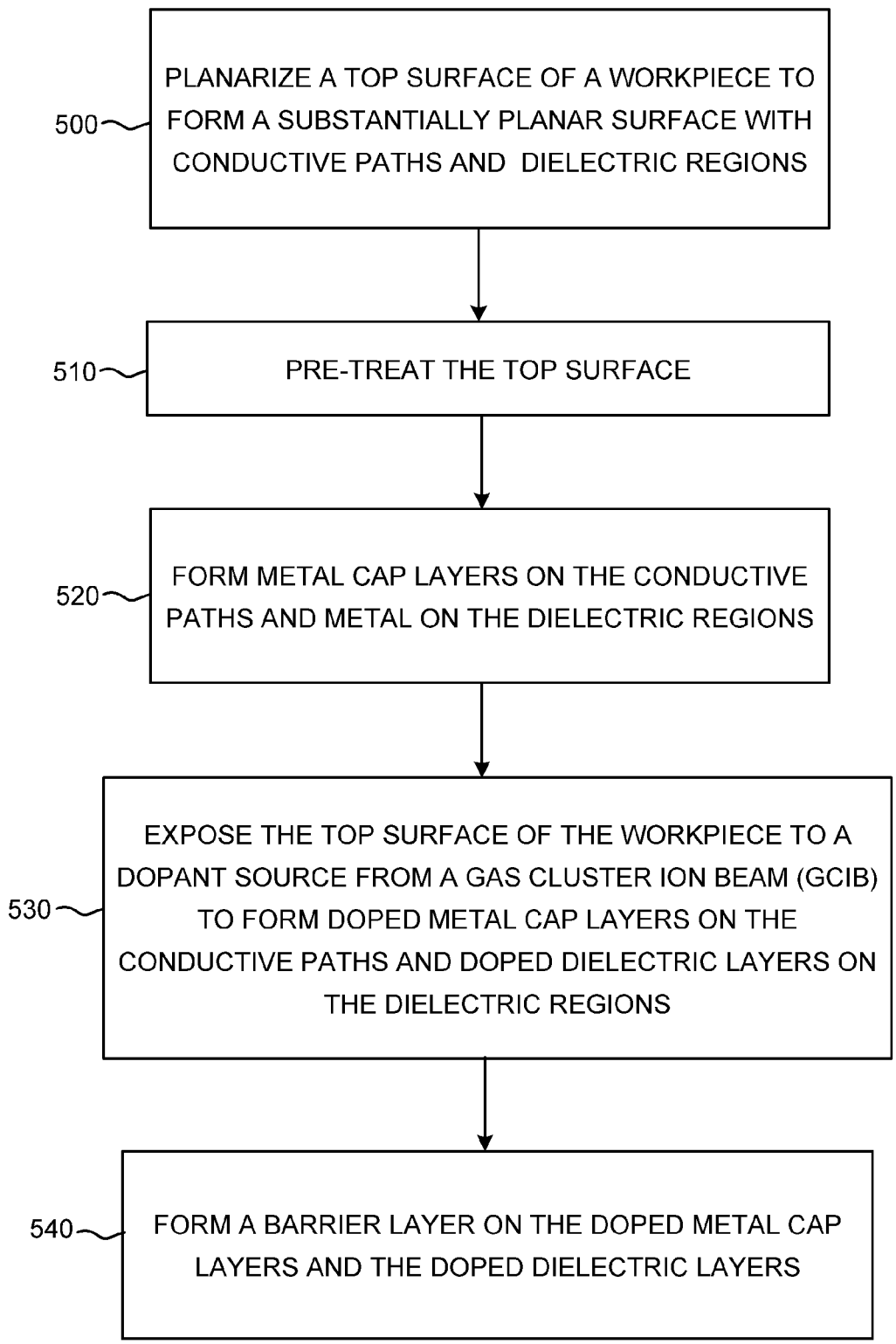
FIG. 5 is a flowchart showing another embodiment of a method of modifying a substantially planar surface of a workpiece with a GCIB.

FIG. 3D is an illustration of the workpiece 153 in FIG. 3C after depositing a barrier layer 250 over the doped metal cap layers 276 and the doped dielectric layer 272. The barrier layer 250 may further getter any remaining metal impurities between the conductive paths 225. The barrier layer 250 is deposited as a conformal layer using methods known to persons having ordinary skill in the art, such as CVD, PECVD, HDPCVD, MOCVD, ALD, PVD, or GCIB. The barrier layer 250 may comprise dielectric material such as silicon nitride or one or more barrier layer materials such as silicon carbide, nitrogen doped silicon carbide, oxygen doped silicon carbide, boron carbon nitride, and boron nitride.

Referring now to FIGS. 4 and 2A-2D, FIG. 4 is a flowchart showing one embodiment of a method of modifying a substantially planar surface of a workpiece 152 with a dopant source 255 during GCIB processing. In element 400, workpiece 152 is planarized to form a substantially planar surface with conductive paths 225 (e.g., Cu metal conductive paths) and dielectric regions 235. In element 410, the planarized top surface 230 is pre-treated to reduce or minimize contaminants from the planarized top surface 230. In one example, the pre-treatment may be a wet chemical cleaning process to remove residual particles and material adsorbed on the planarized top surface 230. The wet chemical clean process may use a post-CMP clean chemistry comprising de-ionized water, benzotriazine, and citric acid or a solution particularly designed for post-CMP cleaning such as a ESC-700 series product manufactured by ATMI. In another example, the pre-treatment may be an infusion etching step performed by a GCIB tool to treat or remove a portion of material from the planarized top surface 230. In another example, the pre-treatment may be a sputtering step performed by a PVD tool to treat or remove a portion of material from the planarized top surface 230. While this embodiment includes a pre-treatment, element 410 is optional.

In element 420, metal cap layers 270 are selectively formed on the conductive paths 225 of the workpiece 152. According to some embodiments of the invention, the metal cap layers 270 contain a noble metal selected from Pt, Au, Ru, Rh, Ir, and Pd.

According to one embodiment, the metal cap layers 270 may be selectively deposited on the conductive paths 225 relative to the dielectric regions 235. According to another embodiment, metal cap layers 270 may be deposited on the conductive paths 225 and metal may be deposited on the dielectric regions 235 due to loss of selectivity during the metal deposition. Subsequently, metal deposited on the dielectric regions 235 and a portion of the metal deposited on the conductive paths 225 may be removed in a metal removal process to selectively form the metal cap layers 270 on the conductive paths 225 relative to the dielectric regions 235.

In element 430, the planarized top surface 230 is treated with a dopant source 255 to form doped dielectric layers 272, doped metal cap layers 276, and optionally doped conductive paths 274, to getter metal contaminants in the dielectric regions 235 and to minimize electromigration in the conductive paths 225. According to some embodiments of the invention, the doped metal cap layers 276 contain a noble metal selected from Pt, Au, Ru, Rh, Ir, and Pd. In element 440, a barrier layer 250 comprising a barrier material such as silicon nitride, silicon carbide, nitrogen doped silicon carbide, oxygen doped silicon carbide, boron carbon nitride, and boron nitride is formed over the doped layers 276 and 272. According to some embodiments, the barrier layer may be formed by CVD, PECVD, HDPCVD, MOCVD, ALD, PVD, or GCIB. In one example, a silicon nitride barrier layer 250 may be formed by a GCIB containing silane ($SiH_4$) and $N_2$. While this embodiment includes forming a barrier layer 250, element 430 is optional.

Referring now to FIGS. 5 and 3A-3D, FIG. 5 is a flowchart showing one embodiment of a method of modifying a substantially planar surface of a workpiece 153 with a dopant source 255 during GCIB processing. In element 500, a workpiece 153 is planarized to form a substantially planar surface with conductive paths 225 and dielectric regions 235. In element 510, the planarized top surface 230 is pre-treated to reduce or minimize contaminants from the planarized top surface 230. Examples of pre-treatments were described above in reference to FIG. 4. While this embodiment includes a pre-treatment, element 510 is optional.

In element 520, metal cap layers 270 are deposited on the conductive paths 225 and metal 278 is deposited on the dielectric regions 235 of the workpiece 153 due to loss of selectivity during the metal deposition. According to some embodiments of the invention, the metal cap layers 270 and metal 278 contain a noble metal selected from Pt, Au, Ru, Rh, Ir, and Pd. In element 530, the planarized top surface 230 is treated with a dopant source 255 during GCIB processing to form doped dielectric layers 272, doped metal cap layers 276, and optionally doped conductive paths 274, to partially or completely remove the metal 278 and other metal impurities in the dielectric regions 235 and to minimize electromigration in the conductive paths 225. According to some embodiments of the invention, the doped metal cap layers 276 contain a noble metal selected from Pt, Au, Ru, Rh, Ir, and Pd. In element 540, a barrier layer 250 comprising a barrier material such as silicon nitride, silicon carbide, nitrogen doped silicon carbide, oxygen doped silicon carbide, boron carbon nitride, and boron nitride is formed over the doped layers 276 and 272. According to some embodiments, the barrier layer may be formed by CVD, PECVD, HDPCVD, MOCVD, ALD, PVD, or GCIB. In one example, a silicon nitride barrier layer 250 may be formed by a GCIB containing silane ($SiH_4$) and $N_2$. While this embodiment includes forming a barrier layer 250, element 530 is optional.

A plurality of embodiments for methods to improve electrical leakage performance and to minimize electromigration in semiconductor devices containing metal cap layers has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or upper layer is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   planarizing a top surface of a workpiece to form a substantially planar surface with conductive paths and dielectric regions;
   forming metal cap layers on the conductive paths; and
   exposing the top surface of the workpiece to a dopant source from a gas cluster ion beam (GCIB) to introduce dopants into at least top portions of the metal cap layers and the dielectric regions to form doped metal cap layers on the conductive paths and doped dielectric layers on the dielectric regions.

2. The method of claim 1, wherein forming the metal cap layers comprises selectively forming metal cap layers on the conductive paths relative to the dielectric regions.

3. The method of claim 1, wherein the metal cap layers and the doped metal cap layers contain a noble metal selected from Pt, Au, Ru, Rh, Ir, and Pd.

4. The method of claim 1, wherein the dopant source comprises dopants containing P, B, or N, or a combination thereof.

5. The method of claim 4, wherein the dopant source comprises a stream of ionized gas clusters of dopant-containing molecules selected from $PH_3$, $BH_3$, $B_2H_6$, $BF_3$, $NF_3$, and $NH_3$.

6. The method of claim 4, wherein the doped metal cap layers and doped dielectric layers comprise between 0.1 atomic % and 10 atomic % of the dopants.

7. The method of claim 1, wherein the dopant source further comprises a non-condensable source gas selected from He, Ne, or $H_2$, or a combination thereof.

8. The method of claim 1, wherein the exposing further forms doped conductive layers between the doped metal cap layers and the conductive paths.

9. The method of claim 1, further comprising:
forming a barrier layer over the doped metal cap layers and the doped dielectric layers.

10. The method of claim 9, wherein the barrier layer comprises silicon nitride, silicon carbide, nitrogen doped silicon carbide, oxygen doped silicon carbide, boron carbon nitride, or boron nitride.

11. The method of claim 9, wherein forming the barrier layer comprises exposing the doped metal cap layers and doped dielectric layers to a gas cluster ion beam (GCIB).

12. The method of claim 1, wherein forming the metal cap layers further comprises forming additional metal on the dielectric regions.

13. The method of claim 12, wherein the exposing to a dopant source from GCIB removes at least a portion of the additional metal from the dielectric regions.

14. The method of claim 13, wherein the exposing comprises simultaneous or sequential GCIB exposures of different dopant sources.

15. A method of forming a semiconductor device, comprising:
planarizing a top surface of a workpiece to form a substantially planar surface with conductive paths and dielectric regions;
selectively forming metal cap layers on the conductive paths relative to the dielectric regions, wherein the metal cap layers contain a noble metal selected from Pt, Au, Ru, Rh, Ir, and Pd; and
exposing the top surface of the workpiece to a dopant source containing dopants selected from P, B, or N, or a combination thereof, from a gas cluster ion beam (GCIB) to introduce the dopants into at least top portions of the metal cap layers and the dielectric regions to form doped metal cap layers on the conductive paths and doped dielectric layers on the dielectric regions, each comprising between 0.1 atomic % and 10 atomic % of the dopant.

16. The method of claim 15, wherein the dopant source comprises a stream of ionized gas clusters of dopant-containing molecules selected from $PH_3$, $BH_3$, $B_2H_6$, $BF_3$, $NF_3$, and $NH_3$, and a non-condensable source gas selected from He, Ne, or $H_2$, or a combination thereof.

17. The method of claim 15, wherein the exposing further forms doped conductive layers between the doped metal cap layers and the conductive paths.

18. The method of claim 15, further comprising:
forming a barrier layer comprising silicon nitride, silicon carbide, nitrogen doped silicon carbide, oxygen doped silicon carbide, boron carbon nitride, or boron nitride over the doped metal cap layers and the doped dielectric layers by exposing the doped metal cap layers and doped dielectric layers to a GCIB.

19. A method of forming a semiconductor device, comprising:
planarizing a top surface of a workpiece to form a substantially planar surface with conductive paths and dielectric regions;
forming metal cap layers on the conductive paths and additional metal on the dielectric regions, wherein the metal cap layers and the additional metal contain a noble metal selected from Pt, Au, Ru, Rh, Ir, and Pd; and
exposing the top surface of the workpiece to a dopant source containing dopants selected from P, B, or N, or a combination thereof, from a gas cluster ion beam (GCIB) to remove at least a portion of the additional metal from the dielectric regions and to introduce the dopants into at least top portions of the metal cap layers and the dielectric regions to form doped metal cap layers on the conductive paths and doped dielectric layers on the dielectric regions, each comprising between 0.1 atomic % and 10 atomic % of the dopant.

20. The method of claim 19, wherein the dopant source comprises a stream of ionized gas clusters of dopant-containing molecules selected from $PH_3$, $BH_3$, $B_2H_6$, $BF_3$, $NF_3$, and $NH_3$, and a non-condensable source gas selected from He, Ne, or $H_2$, or a combination thereof.

21. The method of claim 19, wherein the exposing further forms doped conductive layers between the doped metal cap layers and the conductive paths.

22. The method of claim 19, further comprising:
forming a barrier layer comprising silicon nitride, silicon carbide, nitrogen doped silicon carbide, oxygen doped silicon carbide, boron carbon nitride, or boron nitride over the doped metal cap layers and the doped dielectric layers by exposing the doped metal cap layers and doped dielectric layers to a GCIB.

23. The method of claim 19, wherein the exposing comprises simultaneous or sequential GCIB exposures of different dopant sources.

* * * * *